(12) United States Patent
Li et al.

(10) Patent No.: US 10,847,224 B1
(45) Date of Patent: Nov. 24, 2020

(54) LOW POWER AND AREA TERNARY CONTENT ADDRESSABLE MEMORY CIRCUIT

(71) Applicant: Hewlett Packard Enterprise Development LP, Houston, TX (US)

(72) Inventors: Can Li, Palo Alto, CA (US); Catherine Graves, Palo Alto, CA (US); John Paul Strachan, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/520,243

(22) Filed: Jul. 23, 2019

(51) Int. Cl.
*G11C 15/00* (2006.01)
*G11C 15/04* (2006.01)

(52) U.S. Cl.
CPC .................................. *G11C 15/046* (2013.01)

(58) Field of Classification Search
CPC ................................................... G11C 15/046
USPC ....................................................... 365/49.17
See application file for complete search history.

(56) References Cited

U.S. PATENT DOCUMENTS

| 7,675,765 | B2 | 3/2010 | Derhacobian et al. | |
|---|---|---|---|---|
| 9,847,132 | B1 | 12/2017 | Zheng et al. | |
| 2007/0086227 | A1* | 4/2007 | Krishnan | G11C 15/04 365/49.17 |
| 2014/0334216 | A1* | 11/2014 | Wang | G11C 11/16 365/63 |
| 2015/0206586 | A1* | 7/2015 | Chang | G11C 15/046 365/49.17 |

* cited by examiner

*Primary Examiner* — Vu A Le
(74) *Attorney, Agent, or Firm* — Sheppard Mullin Richter & Hampton LLP

(57) ABSTRACT

Systems, devices, and methods are provided for implementing a low power and area ternary content addressable memory (TCAM). The TCAM comprises a plurality of memristor-based TCAM (mTCAM) cells, each consisting of two memristors and two transistors. The first and second memristors are connected in series, with a first end of the first memristor connected to a first data line, first end of the second memristor connected to a second data line, and the second ends of the resistors connected together at a common node. The drain of a programming transistor is connected to the common node, with the source connected to a third data line, and the gate connected to a word line. Common node is further connected to the gate of a match-line transistor, such that if a mismatch is detected common node applies a voltage to the gate to pull-down the voltage on a pre-charged match line.

20 Claims, 9 Drawing Sheets

US 10,847,224 B1

LOW POWER AND AREA TERNARY CONTENT ADDRESSABLE MEMORY CIRCUIT

DESCRIPTION OF RELATED ART

Content addressable memory (CAM) is a type of memory that can perform a search operation in which a data string may be input as search content and the resulting output is an address of a location in the memory that stores matching data. This is in contrast to a read operation in which an address is input and the resulting output is the data stored in the memory location corresponding to the searched address. Certain CAMs may be able to perform both the aforementioned search operation and the aforementioned read operation, while non-CAM memories may be able to perform the read operation but not the search operation.

Ternary CAM (TCAM) is a type of CAM in which the bit cells can store a wildcard data value in addition to two binary data values. When a bit cell that stores the wildcard value is searched, the result is a match regardless of what search criterion is used to search the bit cell. Certain TCAMs may also allow a search to be conducted on the basis of a wildcard search criterion. When a bit cell is searched based on the wildcard search criterion, the result is a match regardless of what value is stored in the bit cell.

Memristors are devices that may be used as components in a wide range of electronic circuits, such as memories, switches, radio frequency circuits, and logic circuits and systems. In a memory structure, a crossbar array of memory devices having memristors may be used. In memory devices, memristors may be used to store bits of information, 1 or 0. The resistance of a memristor may be changed by applying an electrical stimulus, such as a voltage or a current, through the memristor. Generally, at least one channel may be formed that is capable of being switched between two states-one in which the channel forms an electrically conductive path ("on") and one in which the channel forms a less conductive path ("off"). In some other cases, conductive paths represent "off" and less conductive paths represent "on." Furthermore, memristors may also behave as an analog component with variable conductance.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1:
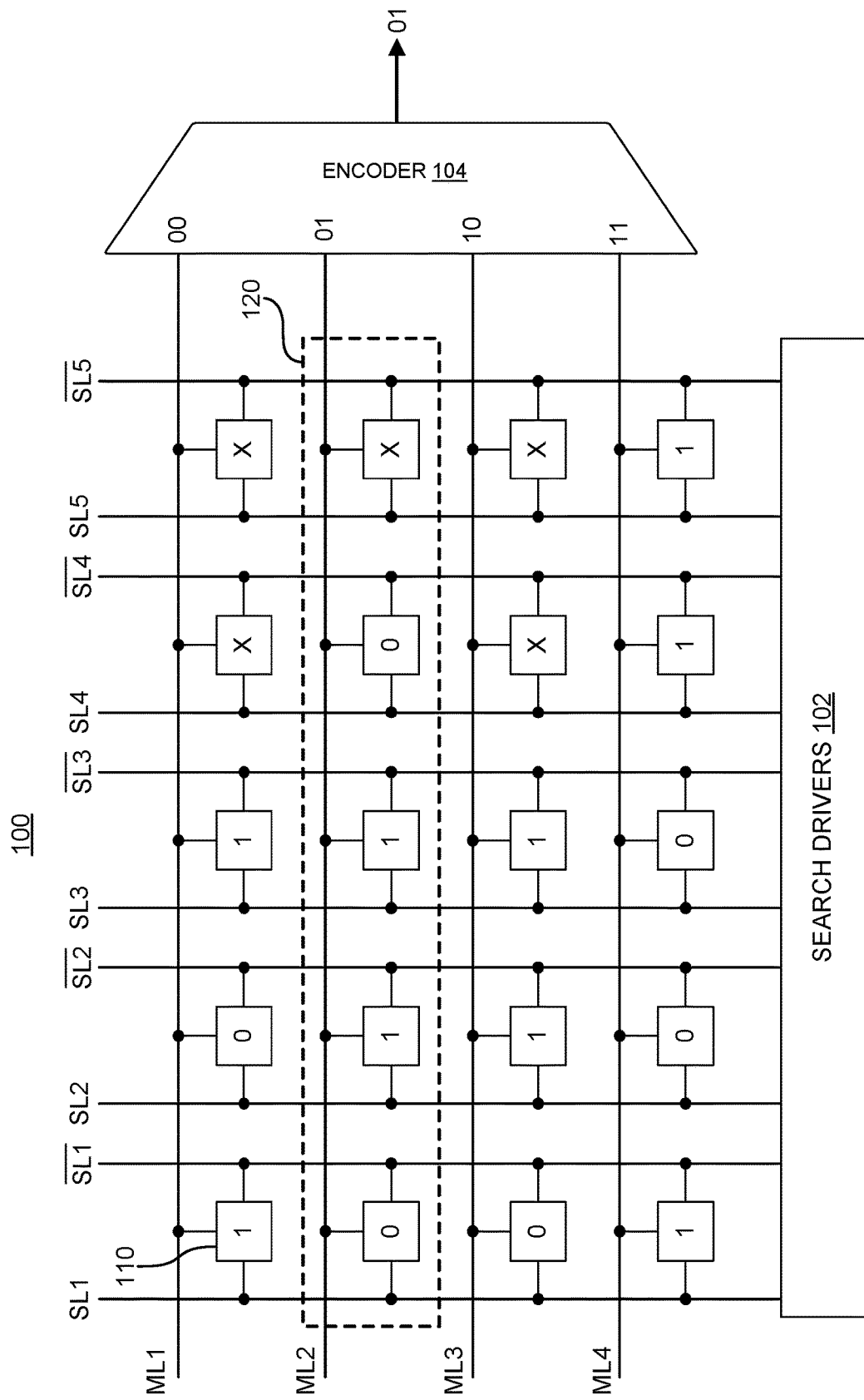
FIG. 1 illustrates an example TCAM in which embodiments of the mTCAM cell in accordance with the technology disclosed herein can be implemented.

The figures are not exhaustive and do not limit the present disclosure to the precise form disclosed.

DETAILED DESCRIPTION

Content addressable memory (CAM) is a hardware that compares the input pattern against the stored binary data. The stored data of a CAM is not accessed by its location but rather by its content. A word, or "tag," is input to the CAM, the CAM searches for the tag in its contents and, when found, the CAM returns the address of the location where the found contents reside. CAMs are powerful, efficient, and fast. The input patterns and data in CAMs are represented by logic '0's and logic '1's (generally referred to as a binary CAM). Reading, writing, and comparing are the three main modes of operation for CAMs. Data stored in CAMs represents the memory address in random-access memory (RAM) where the underlying data sought is stored. If the data in RAM is to be accessed, the CAM is searched for the address associated with that desired data, with the memory address being retrieved from the CAM. In a binary CAM, an input search word is compared to a table of stored words through search lines and, if a match is found for the input search word in the stored CAM words, the CAM returns the address of the matching data to an encoder. If no match is found in any of the stored words, no match is indicated on the match lines and, in some cases, a flag may be triggered indicating the miss.

The TCAMs stores and searches for a third (wildcard) value ('X'), allowing the match for both '0's and '1's. In this way, TCAMs allows for additional complexity, as the search is allowed to search not only for direct matches to the binary inputs ('0's and '1's) but also allows the addition of so-called "don't care" bits, allowing for a bit to be either a logical '0' or logical '1' for a match. The in-memory parallel search nature of the TCAM enables real-time monitoring of the network traffic, and TCAMs are heavily used in networking for rapid network IP lookups and access control lists (ACLs). Large TCAMs are desirable, but a major challenge is that current TCAM implementations are power hungry and the extremely high throughput to keep up with network wirespeeds comes at the expense of high power consumption.

The major portion of the power is consumed by charging the capacitance of the field-effect transistors (FETs) and connection wires. Precharging the match lines is generally the first step in performing a CAM search. Conventionally, the data in the TCAM is stored in the static random-access memory (SRAM). One SRAM-based TCAM cell is usually made up of 16 FETs, which occupies a large area on a chip. This large size consequently consumes a large amount of power as the capacitance of the FETs and longer wire spans are charged. Memristor-based TCAM (mTCAM) cells reduce the number of transistors (i.e., FETs) and accordingly reduces power consumption of the TCAM on the whole. Moreover, the data stored in memristors are non-volatile, rendering the static power consumption (i.e., when the TCAM is in an idle state) negligible. In this way, memristor-based TCAM cells enable lower power maintenance of stored states without requiring a large amount of power. However, mTCAM designs still consume an unnecessarily large amount of dynamic power during precharging, due in large part to the parasitic capacitance on the drain.

Embodiments of the present disclosure proposes a low-power, smaller-area memristor TCAM design. As discussed in greater detail below, the proposed mTCAM cell design employs only two transistors and two memristors, greatly reducing the number of FETs required for traditional SRAM-based TCAM cells and, accordingly, the dynamic power consumption. In addition, zero static power is needed to store the data in the memory of the proposed mTCAM cell compared to traditional SRAM-based TCAM designs. Utilizing an RC-coupled search scheme enables a more reliable search to be performed over previous mTCAM designs as well, enabling for longer word length over implementations utilizing a voltage divider, minimized static current and power consumption, and minimized state disturbance to the memristors due to shorter voltage stressing. Compared to previous mTCAM cell designs, embodiments of the technology disclosed herein have less stringent requirements on the ON/OFF ratio for conducting a search, only requires a single oversized transistor to enable large programming current, and consumes less power on pre-charging match lines due to reduced drain capacitance.

FIG. 1 illustrates an example TCAM 100 in which embodiments of the mTCAM cells in accordance with the technology disclosed herein can be implemented. TCAM 100 comprises a plurality of TCAM cells 110, each TCAM cell 110 comprising both storage and comparison circuitry. Each TCAM cell 110 represents a bit of a stored data word. For example, the five horizontal bits 120 represents a single data word, used to represent one or more addresses within an associated random access memory (RAM) or other storage media of a computing device including example TCAM 100. Each horizontal collection of bits represents a different stored data word of TCAM 100. Match lines ML1-ML4 run horizontally between the data words, and indicate whether the bit of the search word (i.e., comparand) match the bits stored in the TCAM cells 110 of any one of the horizontal data words. Each match line ML1-ML4 can be coupled to inputs of an encoder 104 to generate an address corresponding to a matched data word. In various embodiments, each TCAM cell 110 can be set or reset to represent either a logic '0,' a logic '1,' or (as a ternary CAM) a "don't care" bit (i.e., 'X'). In the illustrated embodiment, each destination address represented by the stored data word and a corresponding port to which data packets need be forwarded is represented in the routing table of Table 1.

TABLE 1

ROUTING TABLE

| Match Line (ML) No. | Address | Search Result | Output Port |
|---|---|---|---|
| 1 | 101XX | 00 | A |
| 2 | 0110X | 01 | B |
| 3 | 011XX | 10 | C |
| 4 | 10011 | 11 | D |

Because of the don't care bits, each of the first three data words (associated with match lines ML1, ML2, ML3, respectively) represents a range of input addresses allowing for more than one data word to indicate a match to the comparand where the non-don't care bits match the respective bit of the comparand. For example, the data word associated with match line ML1 indicates that all addresses within the range 10100 to 10111 are forwarded to port A. The comparand is input into a plurality of search drivers 102, each search driver associated with a column of bits of stored data words.

To perform a search operation, all of match lines ML1-ML4 are precharged by placing them all temporarily in a match state. Once precharged, each search driver of search drivers 102 drive the respective bit of the comparand onto the first search line SL and second search line $\overline{SL}$ of the respective bit column. Each TCAM cell 110 compares its stored bit against the bit on its corresponding search lines SL, $\overline{SL}$. TCAM cells 110 with matching data do not affect the corresponding match line ML1-ML4 (i.e., matched TCAM cells 110 does not pull down the corresponding match line ML1-ML4 from its precharged state). However, TCAM cells 110 with a mismatched bit to the respective bit of the comparand does pull the corresponding match line ML1-ML4 from its precharged state. TCAM cells 110 storing a don't care bit (i.e.,'X') operate as if a match has occurred, never affecting the precharge state of the corresponding match line ML1-ML4. The aggregate result is that match lines ML1-ML4 are pulled down for any word that has at least one mismatch, thereby indicating an overall mismatch to encoder 104. Where all of TCAM cells 110 match the bits of the comparand, the corresponding match line ML1-ML4 remains in the precharge state, indicating a match of the comparand to encoder 104. For example, in the illustrated embodiment of FIG. 1, match lines ML2 and ML3 remain in the precharged state (i.e., indicating a match), while the other match lines ML1 and ML4 are discharged to ground (i.e., pulled down from the precharge state) to indicate a mismatch. Encoder 104 can generate the search address location of the matching data (as identified in Table 1 above). As illustrated in FIG. 1, encoder 104 numerically selects the smallest numbered match line of the two activated match lines M2 and M3 (in the illustrated case, match line M2), generating the match address '01.' This match address is used as the input address to a RAM or other storage media that contains a list of output ports, as indicated in Table 1 above. The match address output of TCAM 100 is used as a pointer, which is used to retrieve associated data from the RAM.

The TCAM search can be viewed as a dictionary lookup where the search data is the word to be queried and the RAM contains the word definitions. A search is conducted for the destination address of each incoming data packet to find the appropriate output port. For example, if the data packet has an incoming address of 01101, the address lookup matches both match line ML2 and ML3 in Table 1. Because match line ML2 has the most defined bits (i.e., the least number of matching don't care bits), match line ML2 is selected as indicating the most direct route to the destination.

In traditional TCAMs, each TCAM cell 110 can be comprised of conventional semiconductor memory (e.g., static random access memory (SRAM)) and comparison circuitry, which enables a search operation to be completed in a single clock cycle. However, SRAM-based TCAM cells require a large number of transistors, requiring a large chip area for each TCAM cell. This reduces the length of the data words that can be searched, limiting the resolution of the search capability of a TCAM. Moreover, the larger number of transistors increases the power consumption of the TCAM. As discussed above, the major portion of the power for the TCAM is consumed during the charging of the transistors (e.g., FETs) and connection wires of the TCAM.

The greater the number of transistors required for a given TCAM cell, the greater the power consumption.

Figure 2:
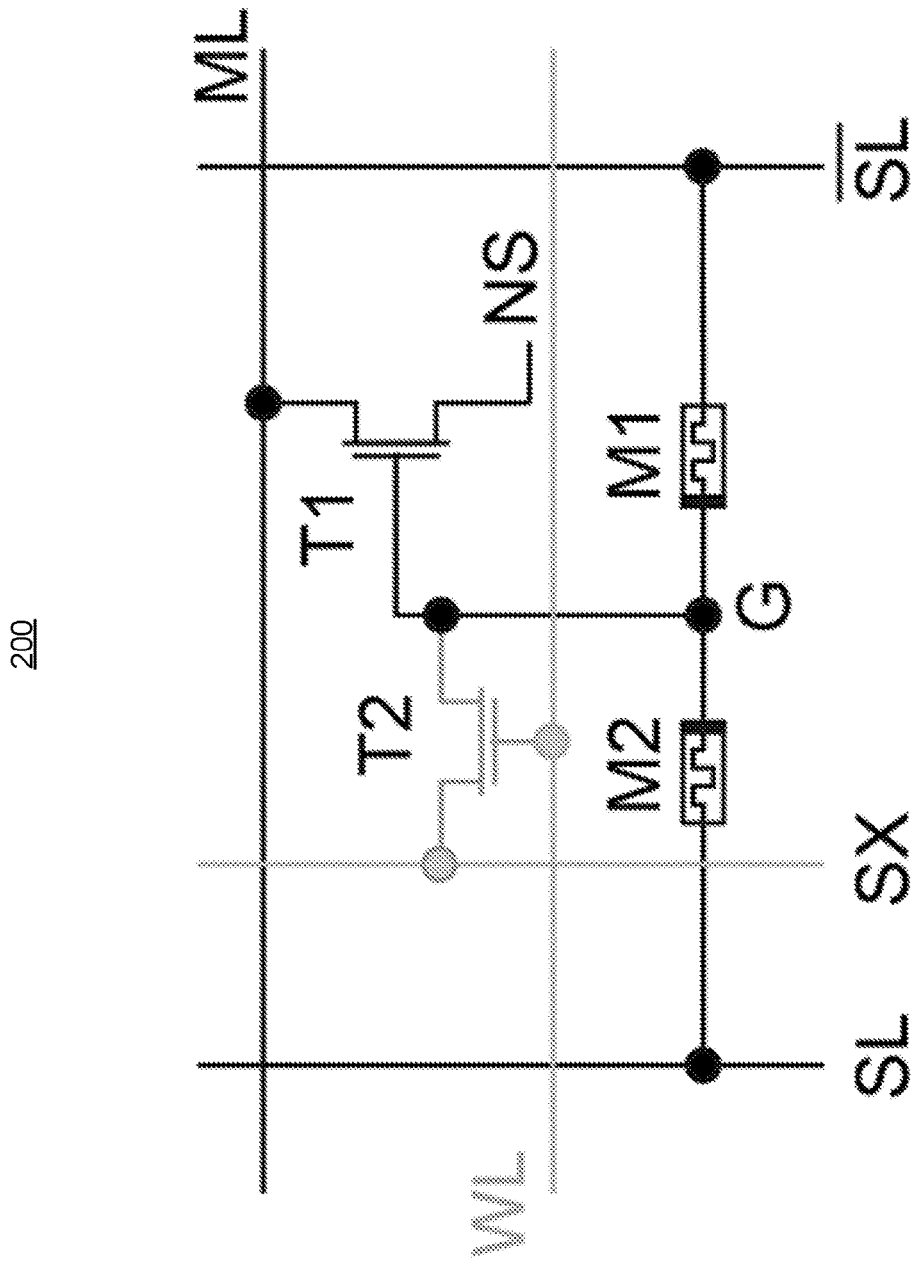
FIG. 2 illustrates an example two transistor, two memristor (2T2M) mTCAM cell in accordance with embodiments of the technology disclosed herein.

To overcome the large power and area requirements of conventional SRAM-based TCAM cells, embodiments of the present disclosure provide a memristor-based TCAM cell suitable for use as the TCAM cells 110 illustrated in FIG. 1. FIG. 2 illustrates an example two transistor, two memristor (2T2M) mTCAM cell 200 in accordance with embodiments of the technology disclosed herein. As stated, example mTCAM cell 200 can be implemented as the plurality of TCAM cells 110 discussed with respect to FIG. 1. Rather than using traditional storage elements, such as SRAMs or DRAMs, mTCAM cell 200 utilizes memristors M1, M2 as the storage elements, enabling mTCAM cell 100 to be a non-volatile memory device. In this manner, programming may be maintained even if power is removed from a TCAM implementing one or more mTCAM cells 200. Moreover, as a result of using mTCAM cell 200, TCAMs implementing a plurality of mTCAM cells 200 are capable of higher storage densities and lower power consumption than comparable TCAMs that use SRAMs or DRAMs as storage elements. mTCAM cell 200 can store three values by changing the resistance states of the two memristors M1, M2. A first combination of resistance states for memristors M1, M2 can correspond to a logic '0,' a second combination of resistance states can correspond to a logic '1,' and a third combination of resistance states can correspond to a wildcard value ('X'), wherein either a logic '0' or logic '1' would be considered a match.

As shown in FIG. 2, mTCAM cell 200 comprises a first memristor M1, a second memristor M2, a first switching transistor T1, and a second switching transistor T2. First memristor M1 and second memristor M2 can be connected in series between a first data line SL and a second data line $\overline{SL}$. First memristor M1 and second memristor M2 may be connected to each other via a common node G. Match-line transistor T1 can be connected between a first rail NS and a match line ML. The second transistor T2 can be connected between the common node G and a third data line SX, therefore common node G can be switchably connected to third data line SX. The gate of second transistor T2 is connected to a word line WL such that the voltage of word line WL can control the conductive state of second transistor T2. Second transistor T2 can serve as the programming transistor for first memristor M1 and second memristor M2. In various embodiments, match-line transistor T1 and second transistor T2 can comprise an n-type metal-oxide-semiconductor (MOS) FET (NMOS), a p-type MOSFET (PMOS), or a complementary MOSFET (CMOS). With the gate of match-line transistor T1 connected to common node G, a voltage of common node G can control the conductive state of match-line transistor T1. Although only discussed with respect to data lines SL, $\overline{SL}$, and SX, each data line can be connected to a plurality of different mTCAM cells 200. Within a TCAM implementing a plurality of mTCAM cells 200, a plurality of first data lines SL, second data lines $\overline{SL}$, and third data lines SX can be present, each associated with a plurality of mTCAM cells 200 in a given column (i.e., arranged to represent the same number bit value of a data word, such as the second bit, third bit, etc.). A person of ordinary skill in the art would understand that the description of how data lines are connected and used in various operations is applicable to other mTCAM cells within a TCAM implementation and not limited solely to a single mTCAM cell. Rather than requiring multiple transistors for programming each memristor M1, M2 in other implementations, connecting a single oversized transistor (i.e., second transistor T2) to common node G between first memristor M1 and second memristor M2 provides the necessary current requirements for programming either memristor M1, M2. Unlike other memristor-based TCAM implementations, using a single oversized transistor saves on chip area (by reducing the number of FETs) while still providing the large currents that may be required to program either or both of memristors M1, M2.

First memristor M1 and second memristor M2 serve as the storage element of each mTCAM cell 200. Applying certain voltage differences across or certain currents through each memristor M1, M2 causes the resistance of the given memristor M1, M2 to change between one of multiple resistance states, with the device maintaining its most recent resistance state even after the voltage/current is removed. In various embodiments, first memristor M1 and second memristor M2 may be capable of changing between a low resistance state and a high resistance state. A respective memristor (M1 or M2) can enter a low resistance state by applying a setting voltage difference of sufficient magnitude across the memristor with a certain polarity, and can enter a high resistance state by applying a setting voltage different of sufficient magnitude with the opposite polarity. Based on the resistance states of each memristor M1, M2, a given mTCAM cell 200 can be programmed to store a logic '0,' a logic '1,' or a "don't care" bit ('X'), as shown in Table 2.

TABLE 2

Stored Values of mTCAM Cell

| Stored Value | Conductance (M2/M1) |
|---|---|
| 0 | Low/High |
| 1 | High/Low |
| X | Low/Low |

The polarities with which the setting/resetting voltage differences may be applied to first memristor M1 and second memristor M2 in order to perform setting and resetting are indicated by a black band on one end of the symbol for first memristor M1 and second memristor M2. In order to set first memristor M1 or second memristor M2 to a low resistance state, the setting voltage difference ($V_{set}$) should be applied across the respective memristor such that a lower voltage is applied to the end of the memristor M1 or M2 that has the black band than is applied to the other end of the respective memristor. To set a respective memristor to a high resistance state, the resetting voltage difference ($V_{reset}$) should be applied across the memristor such that a higher voltage is applied to the end of the memristor that has the black band.

Once set, first memristor M1 and second memristor M2 will tend to stay in its current resistance state until it is reset or set again. In various embodiments, first memristor M1 may be set or reset independently from second memristor M2, enabling the combination of resistances to be used to store a data value as discussed with respect to Table 1. By implementing embodiments of the 2T2M mTCAM cells 200 disclosed herein, greater word lengths are capable of being searched due to the smaller footprint (i.e., area) of the mTCAM cell 200 design. Compared to conventional TCAMs, embodiments of the present disclosure reduce the total number of transistors required, thereby reducing the overall area necessary for the mTCAM. Moreover, because the major portion of the power is consumed at charging the capacitance of the transistors and connection wires, the reduced number of transistors reduces the overall power consumption for the mTCAM.

Figure 3:
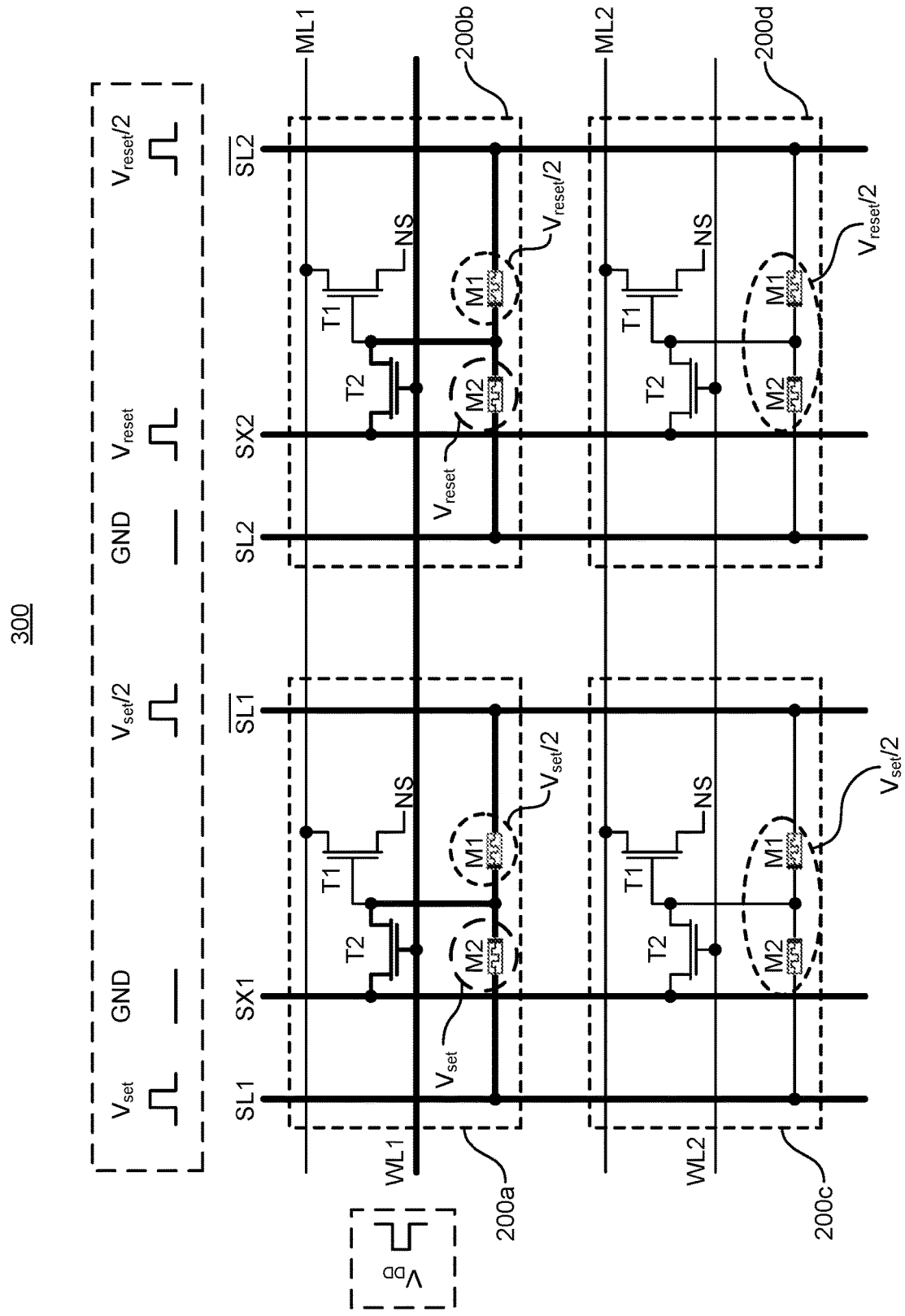
FIG. 3 illustrates an example programming stage of a plurality of example mTCAM cells in an example TCAM in accordance with embodiments of the technology disclosed herein.

Using mTCAM cells in accordance with example mTCAM cell 200 enables a single transistor, second transistor T2, to be used to program the bit stored in each cell 200. FIG. 3 illustrates an example programming stage of a plurality of example mTCAM cells 200 in an example TCAM 300 in accordance with embodiments of the present disclosure. For ease of discussion, programming of mTCAM cells 200a, 200b of mTCAM 200 will be discussed with respect to programming each second memristor M2 of each mTCAM cell 200a, 200b associated with a given word line WL1. As shown in FIG. 3, mTCAM cells 200a, 200b are disposed along a first word line WL1 and mTCAM cells 200c, 200d are disposed along a second word line WL2. In other words, mTCAM cells 200a, 200b are bits of a first word represented by first word line WL1, while mTCAM cells 200c, 200d are bits of a second word represented by second word line WL2. For ease of discussion, first word line WL1 and second word line WL2 are shown as comprising two-bit words, but a person of ordinary skill in the art would understand that each word represented by first word line WL1 and second word line WL2 can comprise a greater number of bits based on the word length of the implementation.

As shown in FIG. 3, different voltages applied to the various wiring lines of TCAM 300 to program a first stored data word associated with first word line WL1. As shown, first word line WL1 is selected by applying a positive supply voltage $V_{DD}$. In various embodiments, positive supply voltage $V_{DD}$ can represent the highest voltage level of TCAM 300. Charging first word line WL1 applies a voltage to the gate of second transistor T2. Because first word line WL1 is connected to second transistor T2, as opposed to being connected to switching transistors between the data lines (first data line SL and second data line $\overline{SL}$), a single transistor can be used for setting each memristors, individually or simultaneously. This reduces the overall power consumption of each mTCAM cell 200a-d, and reduces the surface area required for implementing each mTCAM cell 200a-d. As shown in FIG. 3, second data line WL2 can be floated, remaining unselected. In this way, mTCAM cells 200c, 200d are not affected by application of voltages to the data lines, thereby maintaining the same stored bit value. In various embodiments, more than one word line may be selected at a time, allowing for bits from multiple stored words to be set or reset simultaneously. In such embodiments, the positive supply voltage $V_{DD}$ can be applied to each word line WL for which one or more bits are to be programmed, thereby applying voltage to the gate of each respective second transistor T2 and enabling a potential voltage difference to be applied as required across one or both memristors M1, M2 (based on the bit value to be stored for that mTCAM cell 200).

After selecting first word line WL1, various voltages can be applied to each of the data lines (e.g., first data line SL, second data line $\overline{SL}$, third data line SX) to program each memristor M1, M2 as required for each respective mTCAM cell 200a, 200b. As mentioned above, the illustrative embodiment of FIG. 3 shows how to set second memristors M2 of each mTCAM cell 200a, 200b making up the word associated with first word line WL1. Accordingly, the voltages identified in the broken-line box above the each data line shows the combination of voltages required to set second memristor M2 of a first mTCAM cell 200a to a low resistance state and second memristor M2 of a second mTCAM cell 200b to a high resistance state. With respect to mTCAM cell 200a, a setting voltage $V_{set}$ is applied to first data line SL and a ground voltage GND is applied to the third data line SX. In various embodiments, the setting voltage $V_{set}$ represents a voltage that is higher than a threshold voltage of a respective memristor. When the setting voltage $V_{set}$ is applied across the memristor, the memristor will be set to a low resistance state (i.e., will switch from a high resistance state). With the positive supply voltage applied to the gate of second transistor T2 by first word line WL1, the setting voltage $V_{set}$ is applied to a left side of second memristor M2 by first data line SL of TCAM 300 and the ground voltage GND is applied to the right side of second memristor M2 via common node G (to which the right side of second memristor M2 and the drain of second transistor T2 are connected). In this way, the setting voltage difference is applied across second memristor M2 with a first polarity (i.e., left-to-right), resulting in second memristor M2 being programmed into a low resistance state. By using an oversized transistor for second transistor T2, embodiments of the technology disclosed herein enables the applied setting voltage $V_{set}$ to be closer to the actual voltage drop across the memristor devices, so that the memristor is easier to be programmed. It is because that oversized transistors (like second transistor T2) have a smaller channel resistance, resulting in less voltage drop across and thereby less of an impact on the voltage level required to set the memristors M1, M2.

As shown in FIG. 3, both second memristor M2 and first memristor M1 are connected to the drain of second transistor T2 at common node G. Therefore, when a voltage is applied to third data line SX (assuming the positive supply voltage $V_{DD}$ or other selection voltage has been applied to the gate of second transistor T2 through the respective first word line WL1) the voltage would be seen by both the right side of second memristor M2 (as discussed above) and the left side of first memristor M1. Accordingly, in various embodiments, a bias voltage can be applied to second data line $\overline{SL1}$ of TCAM 300 to ensure that the voltage difference across first memristor M1 does not affect the resistance state of first memristor M1, thereby ensuring only second memristor M2 is being set or reset. The bias voltage can be set much smaller than the set or reset voltages in many embodiments. In the illustrated embodiment, the bias voltage $$\frac{V_{set}}{2}$$

is applied to second data line $\overline{SL1}$ such that the voltage difference across first memristor M1 of mTCAM cell 200a does not exceed a threshold necessary to change the resistance state of first memristor M1 during programming of second memristor M2. In other embodiments, it may be desired to set or reset both second memristor M2 and first memristor M1 simultaneously, in which case a setting voltage $V_{set}$ or resetting voltage $V_{reset}$ may be applied to second data line $\overline{SL1}$ so that first memristor M1 can beset or reset simultaneously with second memristor M2. Regardless, through application of different voltages to the data lines, each memristor of mTCAM cell 200a can be programmed simultaneously or individually.

As shown in FIG. 3, when the given voltages are applied to the data lines and first word line WL1 as shown the result is that second memristor M2 of mTCAM cell 200a is set to a low resistance state (i.e., the voltage difference across second memristor M2 is the setting voltage $V_{set}$) while first memristor M1 remains unaffected (i.e., the voltage difference across first memristor M1 is the bias voltage $$\frac{V_{set}}{2}).$$

Therefore, mTCAM cell 200a is programmed to store a logic '0' or a don't care bit ('X') depending on the prior state of first memristor M1. At the same time, the corresponding bit of a second stored word (associated with second word line WL2) remains unchanged as the voltage difference across first and second memristors M1, M2 of mTCAM cell 200c is the bias voltage $$\frac{V_{set}}{2}.$$

Therefore, in the illustrated embodiment, only mTCAM cell 200a is programmed along the first bit column of FIG. 3.

Table 3 illustrates the various voltages applied to a given mTCAM cell 200 in order to program the mTCAM cell 200a to store a particular bit value. Specifically, Table 3 shows how to set each memristor M1, M2 of a give mTCAM cell 200a to a particular resistance state. The rows of Table 3 correspond to operations and columns correspond to wiring lines (e.g., first data line SL) of the given mTCAM cell 200. Each entry in Table 3 specifies the voltage that is to be applied to the corresponding wiring line during performance of the corresponding operation. For operations where a given data line is not involved or implicated, the bias voltage $$\frac{V_{set}}{2}$$

or $$\frac{V_{reset}}{2}$$

is applied to first data line SL or second data line $\overline{SL}$, respectively. Because the voltage on the data line indicated by the bias voltage does not impact the operation identified (e.g., the voltage on first data line SL does not impact the operation of setting first memristor M1 to a low resistance state), this means that the specific wiring line can be set based on other considerations without directly impacting the respective operation, enabling for multiple operations to be performed in parallel. That is, it is possible for two or more operations to be performed simultaneously as long as the voltages required to be applied to a given data line are not contradictory. In various embodiments, where no voltage is required to be applied to a data line for any of the one or more operations to be performed, the respective data line can be floated to prevent current from flowing through certain circuit components and help reduce power consumption further. In other embodiments, unused wiring lines (i.e., wiring lines for which no voltage is specified as required to perform the operation) can be grounded by applying the ground voltage GND to hold certain circuit components not being used in the operation in an OFF state. The approach to unused wiring lines depends on the particular implementation and a person of ordinary skill in the art would know which method of handling unused wiring lines is appropriate without impacting application of the technology disclosed herein.

TABLE 3

| | Stored Values of mTCAM Cell | | | | |
|---|---|---|---|---|---|
| Operation | WL | SL | $\overline{SL}$ | SX | NS |
| M1 (LRS) | $V_{DD}$ | Vset/2 | $V_{set}$ | GND | GND |
| M2 (LRS) | $V_{DD}$ | $V_{set}$ | Vset/2 | GND | GND |
| M1 & M2 (LRS) | $V_{DD}$ | $V_{set}$ | $V_{set}$ | GND | GND |
| M1 (HRS) | $V_{DD}$ | Vreset/2 | GND | $V_{reset}$ | GND |
| M2 (HRS) | $V_{DD}$ | GND | Vreset/2 | $V_{reset}$ | GND |
| M1 & M2 (HRS) | $V_{DD}$ | GND | GND | $V_{reset}$ | GND |

As indicated, setting second memristor M2 of a given mTCAM cell 200 can be performed by applying a resetting voltage $V_{reset}$ to a third data line SX. As shown in FIG. 3, second memristor M2 of second mTCAM cell 200b is being set to a high resistance state by applying the resetting voltage $V_{reset}$ to the third data line SX2. In this way, the voltage difference across second memristor M2 of second mTCAM cell 200b is the resetting voltage $V_{reset}$, with the voltage difference being a second polarity (i.e., right-to-left). Applying a bias voltage $$\frac{V_{set}}{2}$$

to second data line $\overline{SL2}$ ensures that the voltage difference across first memristor M1 is the bias voltage, thereby maintaining the current resistance state of first memristor M1. In this way, second mTCAM cell 200b as shown is capable of programmed as a logic '1' or a don't care bit ('X') depending on the previous state of first memristor M1 of second mTCAM cell 200b. As can be seen in FIG. 3, setting a memristor in either a low resistance state or a high resistance state in accordance with the technology disclosed herein only relies upon a single transistor, namely second transistor T2. In the case that a large current is required to program memristors M1, M2, second transistor T2 can be "oversized" by enlarging the width of the gate to increase current capability of second transistor T2. This is in contrast to other implementations, where multiple transistors need to be oversized for a large current, and accordingly saves chip area and reduces power consumption. Rather than needing multiple transistors in order to switch between different memristors for programming, implementations in accordance with embodiments of the present disclosure are capable of performing individual programming of memristors with a single transistor (i.e., second transistor T2) without the need to include switching transistors to avoid unintentionally switching a resistance state of a memristor.

Figure 4:
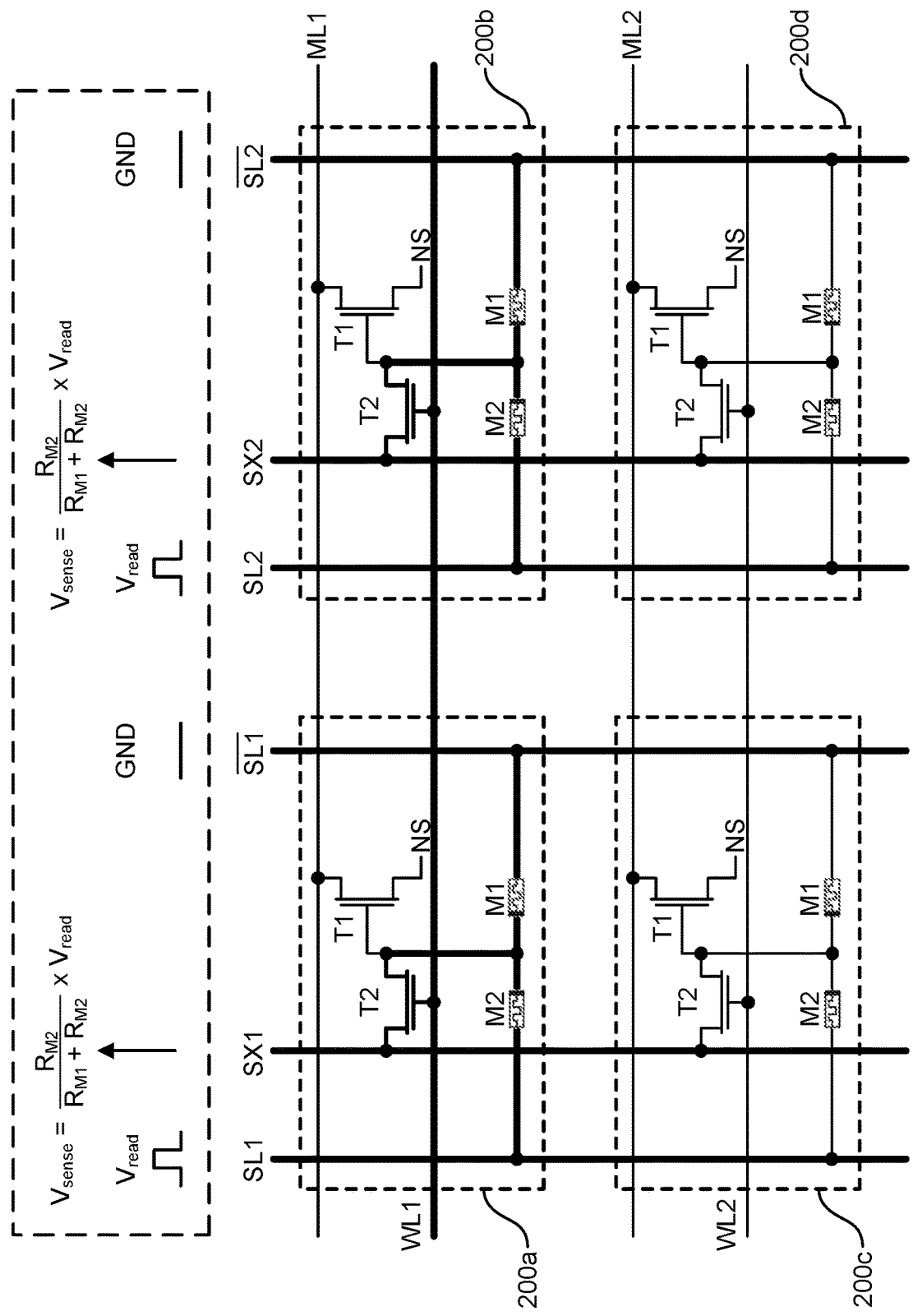
FIG. 4 illustrates an example verification read of example TCAM of FIG. 3 in accordance with embodiments of the technology disclosed herein.

The value that is stored in each mTCAM cell 200a-d can be determined by determining the respective resistance states of both first memristor M1 and second memristor M2 of each respective mTCAM cell 200a-d, and determining which value is associated with the combination of resistance states (i.e., as shown in Tables 1 and 2 above). FIG. 4 illustrates an example verification read of example TCAM 300 discussed with respect to FIG. 3. For ease of discussion, the verification read shall be discussed with respect to reading the resistance state of second memristors M2 of mTCAM cells 200a, 200b associated with the first data word associated with first word line WL1. A person of ordinary skill would understand that the verification read operation discussed is applicable to verification of the programming of all mTCAM cells 200 within TCAM 300, and should not be interpreted as limiting the scope of the technology disclosed herein to only the illustrated embodiment. The verification read operation can be different from a read operation performed by TCAM 300. The verification read operation is focused on reading out the resistance state of each memristor individually, while the read operation of TCAM 300 is a collection of processes that result in the determination of the value stored in mTCAM cell 200a-d.

As shown in FIG. 4, to read the resistance state ratio between the first memristor M1 and the second memristor M2, which determines whether the cell searches for logic '1', '0', or 'X', a read voltage $V_{read}$ is applied to each of the associated first data line SL, SL2 of the respective mTCAM cells 200a, 200b, selected through application of positive supply voltage $V_{dd}$ to WL1. In various embodiments, the read voltage $V_{read}$ can be determined such that the voltage difference across two memristors M1, M2 of each mTCAM cell 200a-d is not sufficient to result in a change in the resistance state of the memristors. While first data lines SL1, SL2 are charged by the read voltage $V_{read}$ ground voltage GND is applied to second data lines $\overline{SL1}$, $\overline{SL2}$, such that the voltage on the SX node is determined by the voltage divider that composed of M1 and M2. An expected sensed voltage $V_{sense}$ can be calculated based on the intended resistance states of each memristor M1, M2 according to equation (2), $$V_{sense} = \frac{R_{M1}}{R_{M1} + R_{M2}} \times V_{read} \qquad (2)$$

wherein $R_{M1}$ is the assumed resistance of first memristor M1 and $R_{M2}$ is the assumed resistance of second memristor M2. To read the resistance of first memristor M1, the voltage signals are applied in the reverse order, with the read voltage $V_{read}$ applied to second data lines $\overline{SL1}$, $\overline{SL2}$, while, a ground voltage GND is applied to first data lines SL1, SL2. To send the voltage on third data lines SX1, SX2 a select voltage (e.g., positive supply voltage $V_{DD}$) can be applied to the specific word line WL1, WL2 to allow for the memristors M1, M2 of the corresponding mTCAM cells 200a-d associated with the word line WL1, WL2 to be selected through application of the positive supply voltage $V_{DD}$ to the gate of each respective second transistor T2.

Once programmed, TCAM 300 can search the data words to identify a particular destination associated with a received data packet. As discussed above with respect to FIG. 1, the search is based on a comparand, which is a binary key. Using the binary key (comparand), the entire TCAM memory can be searched for occurrences of that particular key. For each occurrence found, the TCAM will return the address of where to find the requested memory (after, where multiple matches are found, the best match is selected by TCAM 300). In various embodiments, search drivers (e.g., search drivers 102 discussed with respect to FIG. 1) receives an input address from a processing unit (e.g., one or more of the processing circuitry discussed below with respect to FIG. 6). A search driver may be associated with each column representing a bit position of each stored data word. Each search driver applies a voltage to a respective data line depending on the particular criteria being searched. In various embodiments, depending on the search criteria, each search driver may apply a search voltage $V_{search}$ to one of first data lines SL or second data lines $\overline{SL}$.

Figure 8:
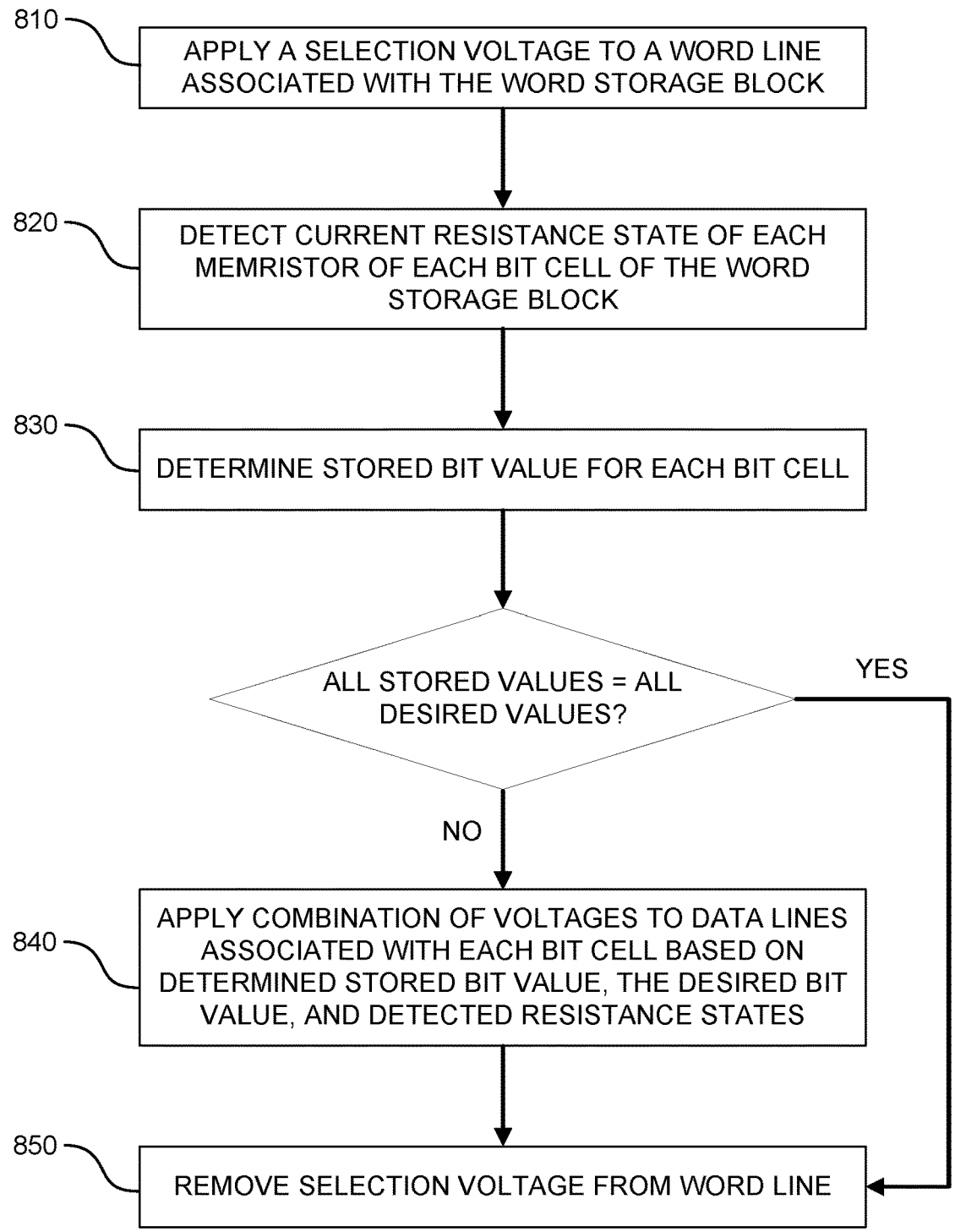
FIG. 8 illustrated an example method in accordance with embodiments of the technology disclosed herein.

FIG. 8 illustrates an example method 800 of programming a word storage block in accordance with embodiments of the technology disclosed herein. The example method 800 is provided for illustrative purposes only and should not be interpreted as limiting the scope of the present disclosure only to programming occurring in the exact manner shown. In various embodiments, method 800 may be performed concurrently with respect to a variety of different word storage blocks, allowing for multiple bit cells of different data words to be programmed simultaneously. In other embodiments, a single data word may require more than one application of method 800 to be fully programmed where more than one word storage block is being programmed at a given time, to account for differences in the required voltages on one or more data lines shared amongst bit cells within a given column of the array (i.e., amongst bit cells of different word storage blocks). A person of ordinary skill in the art would appreciate that the example method 800 may be iteratively applied to ensure each word storage block is properly programmed in an efficient manner. A person of ordinary skill would also understand that "bit cells" refers to the single-bit cells within a word storage block representing the stored data values, similar to the mTCAM cells 200 discussed with respect to FIG. 2.

As discussed above, each row of an array of mTCAM cells 200 (i.e., the mTCAM cells 200 connected to the same word line WL and match line ML) represents a word storage block, which is a representation of a stored data word against which the comparand is compared to determine a match or mismatch. As shown in FIG. 8, at operation 810, control circuitry of a TCAM can apply a selection voltage to the word line associated with a word storage block to be programmed. In various embodiments, applying a selection voltage can comprise applying a positive supply voltage $V_{DD}$ to the associated word line WL of the word storage block to be programmed, similar to the programming discussed with respect to FIG. 3. In other embodiments, a different selection voltage may be applied. The selection voltage may be applied to the associated word line by at least one row driver of the control circuitry. The control circuitry could be similar to the control circuitry discussed below with respect to FIG. 6.

After selecting the word storage block to be programmed, the current resistance states of each memristor of each bit cell of the word storage block is detected. In various embodiments, detecting the current resistance state of each memristor can be determined utilizing equation (2) discussed above with respect to FIG. 4. By sensing the voltage on the third data line it is possible to determine the resistance state of each memristor, based on whether the read voltage $V_{read}$ is applied to the first data line or the second data line. Knowing the current resistance state of each memristor is important to determining the current stored value of the bit cell.

At operation 830, the stored bit value for each bit cell is determined. This determination can be made with respect to the detected current resistance states of the memristors of a given bit cell. A desired value is the data value for a given bit of a data word to be saved in the TCAM for use later in a search operation. The desired value can be either a logic '1', a logic '0', or a wildcard (don't care) bit ('X') in various embodiments. If the current resistance states indicate that all the bits cells of the respective word storage block already contain the desired data value (i.e., the determined stored bit value equals the desired bit value), method 800 can skip to operation 850 and remove the selection voltage from the word line (i.e., deselecting the word storage block and ending programming). If, however, one or more bit cells need to be programmed to the desired data value (i.e., the stored value does not equal the desired value), method 800 moves to operation 840 and applies a combination of voltages to the wiring lines associated with each bit cell based on the determined desired stored bit value and the detected resistance states. In various embodiments, operation 840 may comprise applying the voltages to the different wiring lines as set forth in FIG. 3 above. Where no change is required to the stored value of a bit cell (i.e., the current resistance states equal the required resistance states), a bias voltage may be applied to both wiring lines attached to each memristor of the bit cell, respectively, such that the value of the bit cell is maintained. Once the combination of voltages have been applied (i.e., the bit cells have been programmed), method 800 moves to operation 850 and removes the selection voltage from the associated word line. This switches the programming transistor (i.e., second transistor T2) to an OFF state, severing the current channel between the source and drain of second transistor T2 such that the voltage difference across each memristor is not capable of changing the programmed resistance state.

As seen in FIG. 2, the gate of match line transistor T1 is controlled by the voltage on common node G. As such, common node G controls the conductive state of match-line transistor T1. The voltage of common node G during a search may be modeled by considering first memristor M1 and second memristor M2 of each mTCAM cell 200 as being resistors of a resistor divider (a type of voltage divider). In general, a resistive divider is formed when two resistors are connected in series, input voltages are applied to opposite input terminals of the resistors, and an output voltage is taken from a common node between the resistors. Although a memristor is not exactly the same type of circuit component as a resistor (e.g., memristors's resistance can change over time), when the voltage differences are less than the setting or resetting voltage differences the memristor has an approximately constant resistance, and thus the memristors M1, M2 may be modeled approximately during these periods as resistors.

When first memristor M1 and second memristor M2 are considered as forming a resistive divider, the input terminals of the resistive divider are the left-side terminal of second memristor M2 that is connected to first data line SL and the right-side terminal of first memristor M1 that is connected to second data line $\overline{SL}$. Therefore, the input voltages comprise the voltage signals applied to first data line SL and second data line $\overline{SL}$, with the output terminal of the resistive divider comprising common node G. In this way, the voltage output by the resistive divider is the voltage of common node G, as determined according to equation (3):

$$V_G = \frac{R_{M2} V_{search} + R_{M1} V_{search}}{R_{M1} + R_{M2}} \quad (3)$$

where $R_{M1}$ is the present resistance of first memristor M1, and $R_{M2}$ is the present resistance of second memristor M2 of a given mTCAM cell 200.

TABLE 4

| | | Search Voltage at Common Node G | | |
|---|---|---|---|---|
| Stored Bit Value | Conductance (M2/M1) | SL/$\overline{SL}$ ($V_{search}$,0) | SL/$\overline{SL}$ (0, Vsearch) | SL/$\overline{SL}$ (0,0) |
| 0 | Low/High | ~$V_{search}$ | ~0 | 0 |
| 1 | High/Low | ~0 | ~$V_{search}$ | 0 |
| X | Low/Low | ~$V_{search}$/2 | ~$V_{search}$/2 | 0 |

Table 4 shows the voltages at common node G based on the search criteria. During a search operation based on a logic '0' search criterion, the search voltage $V_{search}$ is applied to first data line SL and a ground voltage GND is applied to second data line $\overline{SL}$. In some embodiments, second data line $\overline{SL}$ may be left floating rather than being tied to ground GND. Therefore, when input into equation (3), the voltage at common node G ($V_G$) can be expressed as:

$$V_G = \frac{R_{M2}}{R_{M1} + R_{M2}} \times V_{search} \quad (4)$$

During a search operation based on a logic '1' search criterion, the search voltage $V_{seach}$ is applied to second data line $\overline{SL}$ and a ground voltage GND is applied to first data line SL. In some embodiments, first data line SL may be left floating rather than being tied to ground GND. Therefore, when input into equation (3), the voltage at common node $V_G$ can be expressed as:

$$V_G = \frac{R_{M1}}{R_{M1} + R_{M2}} \times V_{search} \quad (5)$$

When a match occurs, the voltage on common node G is designed to be roughly zero, as shown in FIG. 4, based on equations (3)-(5). In this way, the voltage necessary to switch match-line transistor T1 to pull down the voltage on the match line ML is not provided to the gate of match-line transistor T1. In various embodiments, where the voltage $$\frac{V_{search}}{2}$$

is set lower than the threshold voltage for switching match-line transistor T1, the results are similar to that of a match (i.e., similar to the results being a voltage close to zero and match-line transistor T1 remaining in an OFF state). However, where the voltage at common node G is roughly the same as the search voltage $V_{search}$, a mismatch is indicated. The voltage at common node G is applied to the gate of match-line transistor T1, causing T1 to switch and pull down the voltage on the associated match line ML. As shown in Table 4, there are two instances where the voltage at common node G results in a mismatch being indicated (i.e., the voltage on the match line ML is pulled down by match-line transistor T1).

In some embodiments, where the common node voltage is $$\frac{V_{search}}{2},$$

the subthreshold leakage is not absolute zero despite the fact that it is lower than the threshold. This may cause an unwanted mismatch result when the total subthreshold leakage is large enough on a given match line ML (i.e., the additive leakage of match-line transistors with a gate voltage of $$\frac{V_{search}}{2}\Bigg),$$

potentially limiting the word length capable to be searched by the TCAM. Rather than utilizing a resistive divider arrangement, like the resistive divider formed by first and second memristors M1, M2 in FIGS. 2-4, utilizing RC coupling to counter the parasitic capacitance in mTCAM cell 200 from second transistor T2 and match-line transistor T1 by isolating the DC-portion of the voltage signal.

Figure 5:
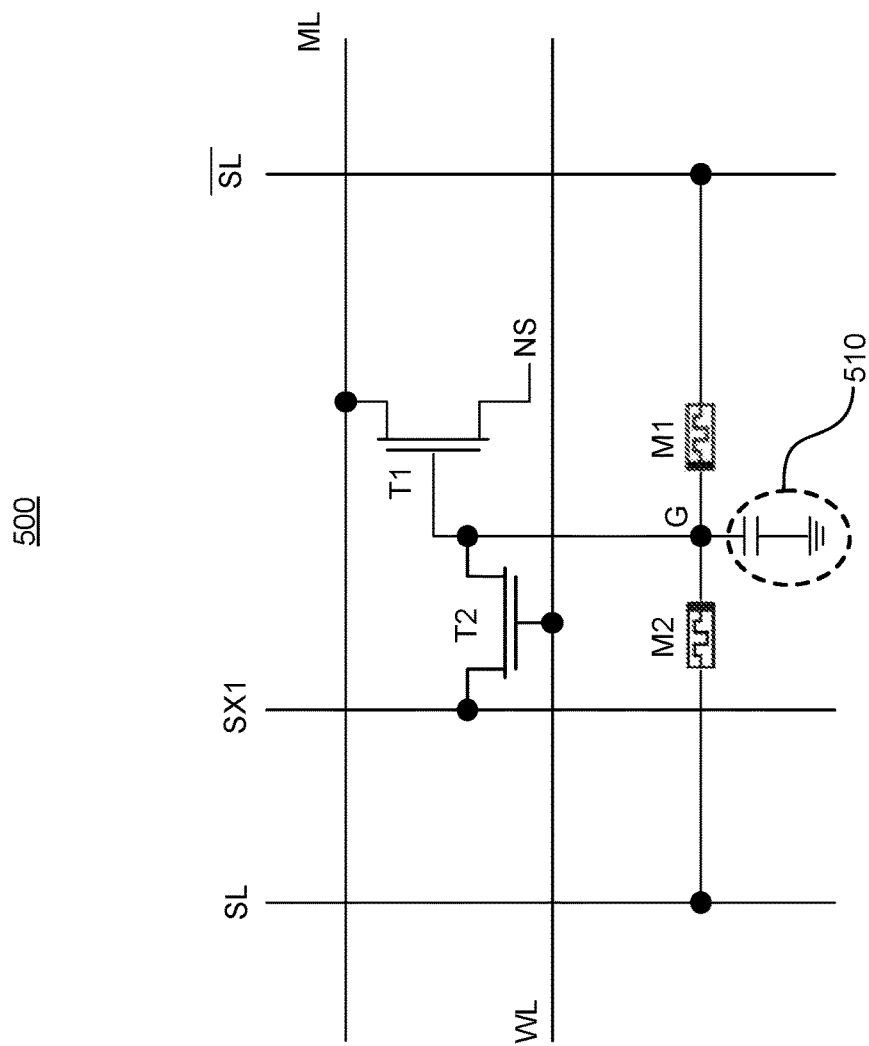
FIG. 5 is another example mTCAM cell in accordance with embodiments of the technology disclosed herein.

To account for subthreshold leakage, in various embodiments the search could be performed through an RC-coupled search. Because common node G needs to go through one of memristors M1, M2 to be charged up, where both memristors are in a high resistance state such charging of common node G may not occur during a given period (i.e., it may take time for common node G to be charged up). Therefore, by utilizing RC-coupling and designing the period in which the search is conducted to occur prior to the potential charging of common node G, the voltage of match line ML will not be pulled down. In this way, the voltage on the gate of the pull down transistor (match-line transistor T1) at a given time is a function of the memristor conductance and the capacitance. Different RC time constants from different search configuration will yield different search results. (described below)

Where the parasitic capacitance from second transistor T2 and match-line transistor T1 is not large enough, an additional capacitor may be included to allow for efficient RC-coupled searching. Such RC coupling can be performed in the example mTCAM cell 500 in accordance with the present disclosure, as shown in FIG. 5. Example mTCAM cell 500 can be implemented in a similar manner as that of mTCAM cell 200 discussed with respect to FIG. 2. For ease of discussion, example mTCAM cell 500 can be similar to mTCAM cell 200 discussed with respect to FIGS. 2-4. As shown in FIG. 5, a capacitor 510 is connected to common node G at one end, and connected to ground on the other end.

TABLE 5

Search Voltage at Common Node G

| Stored Bit Value | Conductance (M2/M1) | SL/$\overline{SL}$ ($V_{search}$,0) | SL/$\overline{SL}$ (0, Vsearch) | SL/$\overline{SL}$ (0,0) |
|---|---|---|---|---|
| 0 | Low/High | ~$R_{LRS}C$ | ~$R_{HRS}C$ | 0 |
| 1 | High/Low | ~$R_{HRS}C$ | ~$R_{LRS}C$ | 0 |
| X | Low/Low | ~$R_{HRS}C$ | ~$R_{HRS}C$ | 0 |

Although the search is performed in a different manner, the RC-coupled search includes the same distribution of results as the DC search discussed above. As shown in Table 5 above, instead of focusing on the voltage at common node G at a given moment, the RC-coupled search is concerned with the RC time constant ($\tau$). Assuming that an associated match line ML is sensed when time t is:

$$\tau_{match} > \tau > \tau_{mismatch} \qquad (1)$$

wherein $\tau_{match}$ is approximately $R_{HRS}C$ and $\tau_{mismatch}$ is approximately $R_{LRS}C$. Accordingly, at time t, a mismatch occurs where the RC time constant is approximately $R_{LRS}C$. As an example, looking at Table 5, if the resultant RC time constant when the search voltage $V_{search}$ is applied to first data line SL and zero voltage is applied to second data line $\overline{SL}$ (i.e., the search criterion is searching for a logic '1') is approximately $R_{LRS}C$, a mismatch is indicated. The gate of match-line transistor T1 will be activated to switch transistor positions and pull down the voltage on the associated match line ML from its precharge-state.

Figure 6:
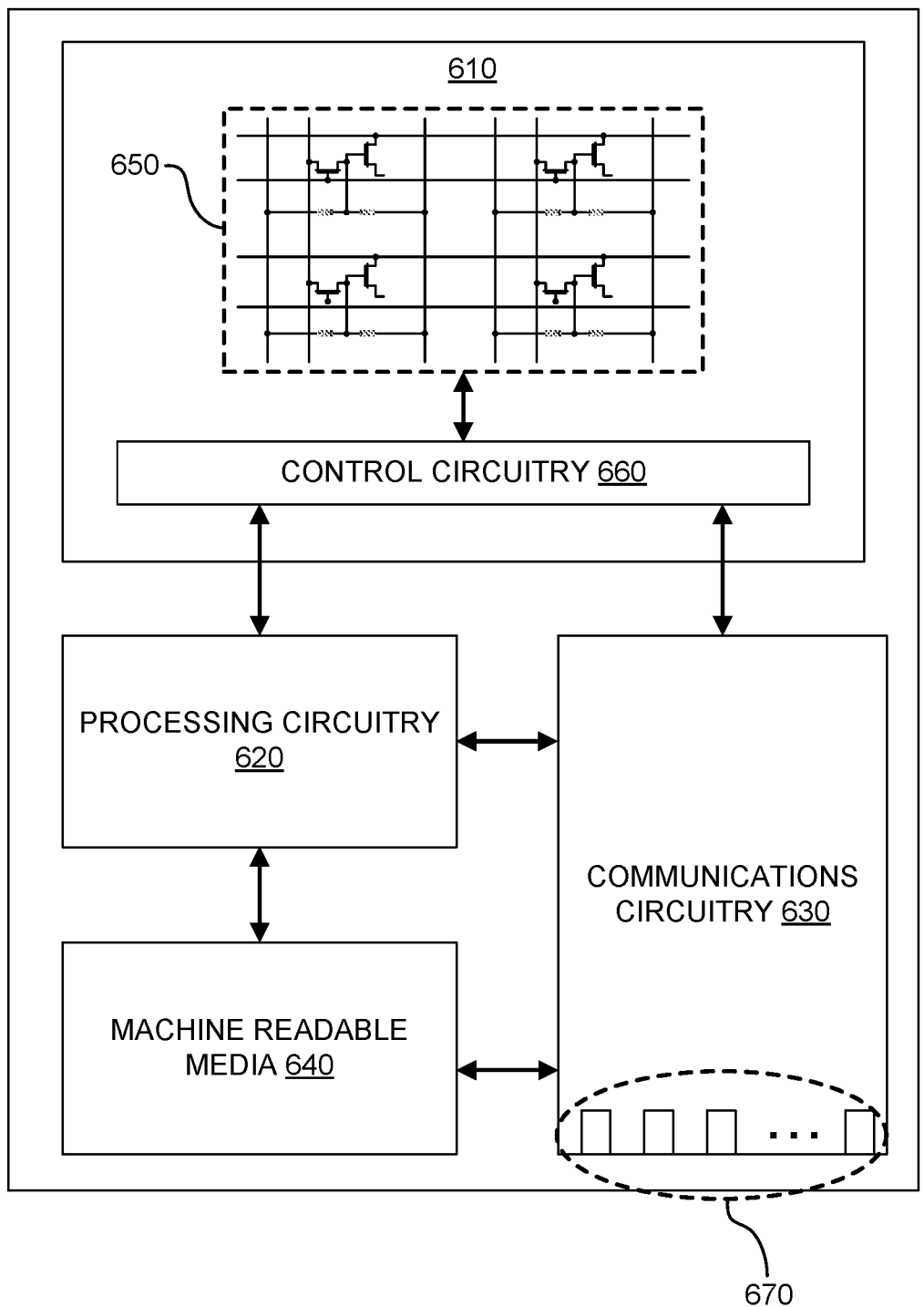
FIG. 6 illustrates an example device in accordance with embodiments of the technology disclosed herein.

FIG. 6 illustrates an example device 600 in which an example TCAM, such as example TCAM 300 or TCAM 500 discussed with respect to FIGS. 3-5, can be implemented. In various embodiments, device 600 can comprise any number of different computing devices known in the art that suitable for implementing content addressable memory, including but not limited to servers, network switches, gateway devices, among other devices. For ease of discussion, certain aspects of example device 600 shall be described below under the assumption device 600 comprises a network device (e.g., switch, gateway, etc.), but it should be understood that device 600 could be any type of electronic device. For ease of discussion, components of device 600 which are commonly used in devices of the kind and which are not related to the functionality of a content addressable memory implementation are omitted, but this omission should not be interpreted as limiting the scope of the disclosure as excluding those component from the scope of the issued claims.

As shown in FIG. 600, device 600 includes a TCAM 610, processing circuitry 620, communications circuitry 630, and a machine readable media 640. In various embodiments, TCAM 600 can be similar to example TCAM 200 discussed with respect to FIGS. 2-4, example TCAM 500 discussed with respect to FIG. 5, or another memristor-based TCAM cell. An array of mTCAM cells 650 can be included, the array representing one or more data words, similar to those discussed with respect to FIG. 1. In various embodiments, each mTCAM cell 650 can be similar to the mTCAM cell 200 or mTCAM cell 500 discussed with respect to FIGS. 2-5. In various embodiments, TCAM 610 can include control circuitry 660.

Figure 7:
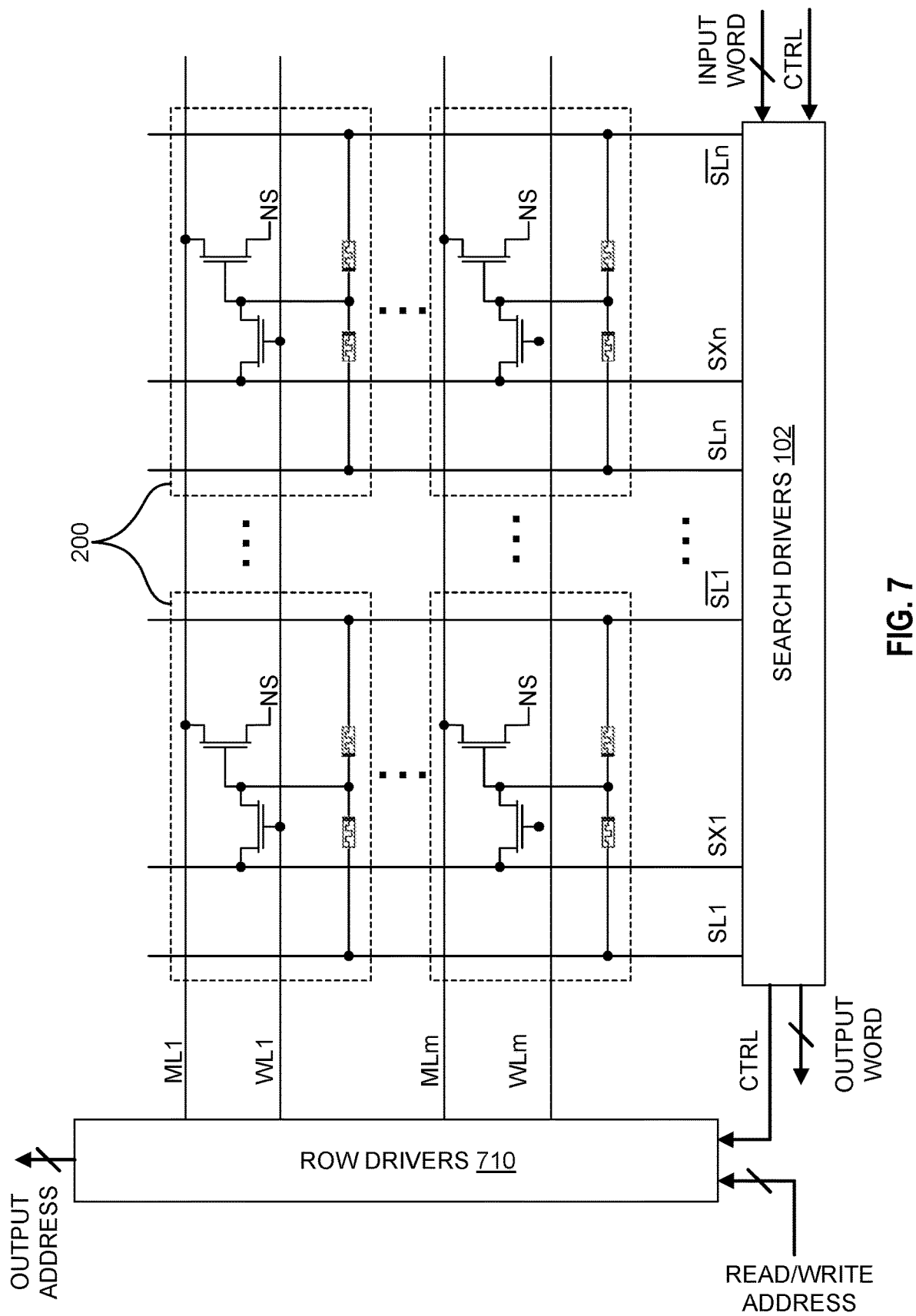
FIG. 7 shows an example TCAM including example control circuitry in accordance with embodiments of the technology disclosed herein.

FIG. 7 shows an example TCAM 610, including example control circuitry 610 (comprising column drivers 710 and row driver 720), in accordance with embodiments of the present disclosure. As illustrated, TCAM 610 comprises an array of mTCAM cells 200, the array comprising M rows and N columns. Each row of TCAM 610 represents one word storage block. TCAM 610 can comprise a plurality of word lines WL1-WLm, a plurality of match lines ML1-MLm, a plurality of first data lines SLn, a plurality of second data lines $\overline{SLn}$, and a plurality of third data lines SXn. Because there is one word storage block per row (i.e., each row represents one data word), the length of data words are limited by the number mTCAM cells 200 which may comprise any row of TCAM 610. Each M column corresponds to a specific bit position (e.g., bit 0, bit 1, bit 7, etc.) of the data word. The data value stored in a given mTCAM cell 200 corresponds to a specific bit of a word that is stored in the word storage block that includes the given mTCAM cell 200, with the position of the bit within the stored word being determined by the bit position of the column in which the respective mTCAM cells 200 are disposed.

In various embodiments, control circuitry 660 applies signals to the various wiring lines mentioned above so as to control operations of mTCAM cells 200, such as read, write, and search operations. As illustrated in FIG. 7, control circuitry 660 of FIG. 6 is illustrated as comprising column driver 710 and row driver 720. Row driver 720 may include one or more drivers, shift registers, decoders, and the like that are connected to and drive wiring lines that correspond to rows of the array of mTCAM cells 200. In various embodiments, row driver 720 can include the encoder 104 discussed with respect to FIG. 1. Column driver 710 may include one or more drivers, shift registers, decoders, and the like that are connected to and drive wiring lines that correspond to columns of the array of mTCAM cells 200.

Row driver 720 can be connected to word lines WL1-WLm and match lines ML1-MLn and be configured to supply or sense electrical signals carried on these wiring lines. For example, the row driver 720 may include decoders and drivers that are to select one of the word storage blocks by applying the positive supply voltage $V_{DD}$ to one of word lines WL1-WLm based on an input read/write address during a read or write operation. During a search operation, row driver 720 can be configured to apply the positive supply voltage $V_{DD}$ to all of word lines WL1-WLn. In some embodiments, row driver 720 can include one or more decoders or drivers that are to, during a search operation, pre-charge all of match lines ML1-MLm, sense which match lines of the plurality of match lines WL1-WLm do or do not have their voltage pulled low (down), and output addresses of any word storage block whose match line ML1-MLm were not pulled low.

Column driver 710 in various embodiments may be connected to the plurality of first data lines SLn, the plurality of second data lines $\overline{SLn}$, and the plurality of third data lines SXn, and may supply electrical signals to and/or sense electrical signals carried on these wiring lines. For example, column driver 710 can include decoders and drivers that are to selectively apply the variety of voltages discussed above with respect to FIGS. 2-6.

It should be understood that separate drivers could be provided to drive different types of wiring lines (e.g., one driver drives first data lines SL and a separate driver drives second data lines $\overline{SLn}$), or that a single driver could be provided to drive multiple different types of wiring lines (e.g., a single driver drives both the first data lines SL and second data lines $\overline{SLn}$). Furthermore, it should be understood that the various components of control circuitry 660 could be physically located on any side or combination of sides of the array of mTCAM cells 200, and that the relative locations illustrated in FIG. 7 are not intended to imply physical locations of the components in a physical device that instantiates the example TCAMs discussed with respect to this disclosure.

Referring back to FIG. 6, Processing circuitry 620 may supply the control signal to the control circuitry 660. Processing circuitry 620 can be any circuitry capable of executing non transitory machine-readable instructions, such as a central processing unit (CPU), a microprocessor, a microcontroller, a digital signal processor (DSP), etc. Processing circuitry 620 may also be an application-specific integrated circuit (ASIC), a field-programmable gate array (FPGA), an application-specific instruction set processor (ASIP), or the like, that is configured to perform certain operations. In various embodiments, control circuitry 660 may be included within processing circuitry 620.

Figure 9:
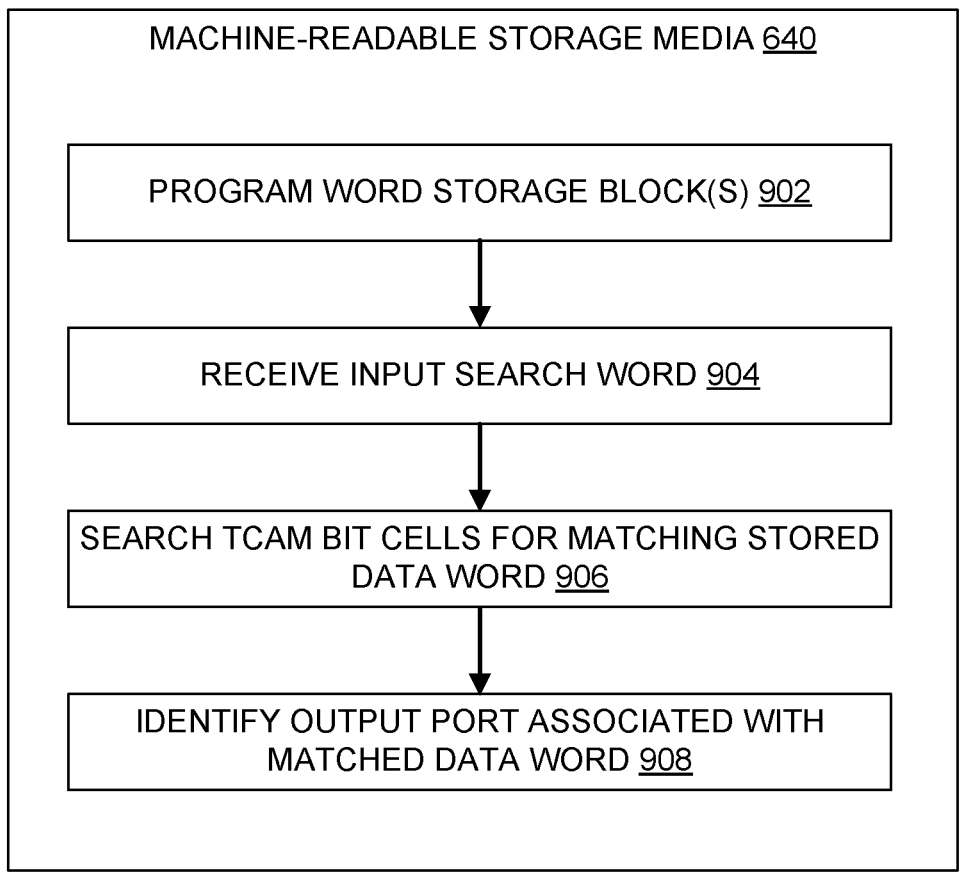
FIG. 9 illustrates an example machine-readable storage media with instructions in accordance with embodiments of the technology disclosed herein.

Machine-readable media 640 can be any non-transitory machine-readable medium, including but not limited to volatile storage media (e.g., dynamic RAM (DRAM), SRAM, etc.) and/or non-volatile storage media (e.g., PROM, EPROM, EEPROM, NVRAM, hard drives, etc.). Non-limiting examples include: flash memory, solid state storage devices (SSDs); a storage area network (SAN); removable memory (e.g., memory stick, CD, SD cards, etc.); or internal computer RAM or ROM; among other types of computer storage mediums. Machine-readable media 640 can store machine-readable instructions that, when executed by processing circuitry 610, cause device 600 to perform one or more operations, such as the programming, searching, and reading operations discussed above. As a non-limiting example, machine-readable media 640 can store instructions causing the processor to control the actions of control circuitry 660, executing a search operation through control circuitry 660. FIG. 9 illustrates an example machine-readable storage media 640 in accordance with embodiments of the technology disclosed herein. As shown, machine-readable storage media 640 can be configured to store instructions executable by hardware processors, such as the processing circuitry discussed with respect to FIG. 6. The instructions stored on machine-readable storage media 640 illustrated in FIG. 9 may include various sub-instructions for performing the function embodied by the identified instructions. For example, the instruction "program word storage block(s)" 906 may include various sub-instructions for determining which word storage blocks to program and the required voltages for storing specific data values in each bit cell of a word storage block in a manner similar to the method 800 discussed with respect to FIG. 8 above, and the programming procedure discussed above generally. The instruction "receive input search word" 904 can include various sub-instructions for receiving a communication data packet from another source over communications circuitry similar to the reception discussed with respect to FIG. 6 above. Moreover, receiving the input search word may comprise retrieving a destination address from the received communication data packet as discussed with respect to the search procedure discussed with respect to FIGS. 1 and 7. The instruction "search TCAM bit cells for matching stored data words" 906 can include sub-instructions for performing the search procedure in a manner as that discussed with respect to FIGS. 1 and 7, including identifying the destination address of a received communications data packet, sending a control signal from the processing circuitry to control circuitry of the TCAM, applying the necessary voltages to the wiring lines associated with each bit cell based on the search criterion (i.e., the bits of the comparand), and determining a best matched word storage block of the TCAM array. The instruction "identify output port associated with matched data word" 908 can include sub-instructions for determining which output port is associated with the best matched word storage block identified through the search operation in a manner similar to that discussed with respect to FIGS. 1, 6, and 7. In some embodiments, identifying the output port may be performed by control circuitry of the TCAM or by communications circuitry in a manner similar to that discussed with respect to FIGS. 1 and 6.

Communications circuitry 630 can include transceiver circuitry for receiving input data communications and transmitting output data communications. In various embodiments, communications circuitry 630 can comprise a network interface card (NIC) including a plurality of different communication ports in compliance with a plurality of different communication standards. In various embodiments, communications circuitry 630 can include a plurality of communications ports 670, which can serve to connect multiple other electronic devices to one another via device 600. As a non-limiting example, device 600 could be a network router, switch, gateway, or other routing device for a network, and may perform various traffic control tasks such as routing, switching, etc.

In some embodiments, communications circuitry 630 can determine which communication port 670 to forward the received communication to based on the destination address identified in the received data packet. Device 600 can utilize TCAM 610 to identify the communications port 670 to which to send a received data packet by searching TCAM 610 using the destination address in the received data packet.

For example, device 600 may be connected in a network to a plurality of other devices, each of the other devices having a unique address (e.g., a unique IP address). Device 600 may store this information in TCAM 610 such that the location of the stored device address within TCAM 610 corresponds to a specific communications port 670 through which device 600 and a particular other device are connected. Each stored word in TCAM 610 can correspond to a different communications port 670. In various embodiments, when a new device is connected to device 600, the unique address for the newly-added device can be written to a data word of TCAM 610. Upon receipt of a new data communication (packet), a destination address included within the received data packet is extracted and sent to TCAM 610 directly from communications circuitry 630 in some embodiments, while in other embodiments the destination address may be provided indirectly through processing circuitry 620. The destination address serves as the input comparand for conducting the TCAM search. If a match is identified, TCAM 610 returns a memory address (e.g., an location within RAM) to communications circuitry 630, either directly or through processing circuitry 620. Because each data word of TCAM 600 corresponds to a particular communications port 670 of communications circuitry 630, the memory address of the stored data word associated storage block can be understood by communications circuitry to identify a particular communications port 670, and therefore the communications circuitry 630 can determine which communications port 670 to forward the communication packet based on the output address of TCAM 610.

In the art, the term "memristor" may be used in certain contexts in abroad sense and may be used in certain contexts in a narrow sense. In a narrow sense, "memristor" may refer specifically to circuit elements that exhibit a non-linear relationship between electric charge and magnetic flux (or exhibit a relationship between the time integral of current and the time integral of voltage). In a broad sense, "memristor" refers broadly to any non-volatile memory element that is based on changing resistance states and is read by its resistance. Herein and in the appended claims, "memristor" is always used in the broad sense, unless specifically indicated otherwise. Specifically, as used herein, "memristor" refers broadly to any non-volatile memory element that is based on changing resistance states and is read by its resistance. Thus, memristors M1, M2 can each be, for example, a memristor in the narrow sense of the term, a memory element that changes the resistance across a dielectric solid-state material, a resistive random-access memory element (sometimes referred to as a RRAM or ReRAM), a phase-change memory element (sometimes referred to as PCM of PCRAM), a conductive-bridging memory element (sometimes referred to as CBRAM or a programmable metallization cell), a magnetoresistive memory element (sometimes referred to as MRAM), amongst others.

The example TCAMs are described herein and illustrated in the drawings in a conceptual or schematic manner to aid understanding. In particular, physical structures in the example TCAMs are referred to and/or illustrated conceptually herein as circuit components, and the relationship between these circuit components are illustrated in circuit diagrams in accordance with the usual practice in the art. Circuit components are conceptual representations of classes of physical structures or devices that perform certain functions and/or have certain properties. Examples of such circuit components include passive devices such as resistors, capacitors, memristors, etc.; active devices such as transistors, diodes, etc.; constituent elements of the active/passive devices such as terminals, electrodes, gates, sources, drains, etc.; elements that connect devices such as wiring lines, nodes, etc.; amongst others. It should be understood that a single physical structure (or set of physical structures) in an actual physical incarnation of an example TCAM in accordance with the technology disclosed herein can serve multiple functions and/or have multiple properties, and thus a single physical structure (or a set of physical structures) may be described and/or illustrated herein as multiple distinct circuit components. For example, a single piece of metal in a particular physical incarnation of an example TCAM can serve as both a gate electrode of a transistor and as a wiring line. Thus, the fact that two or more circuit components may be referred to or illustrated herein as distinct components should not be interpreted to mean that their corresponding physical structures in a physical incarnation of the example TCAM are distinct structure.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A memristor-based ternary content addressable memory (mTCAM) cell, comprising:
 a first memristor connected in series to a second memristor, wherein:
  a first end of the first memristor is connected to a first data line;
  a first end of the second memristor is connected to a second data line; and
  a second end of the first memristor and a second end of the second memristor are connected together at a common node;
 a match-line transistor being connected on a first end to a match line, a gate of the match-line transistor being connected to the common node;
 a programming transistor being connected on a first end to a third data line, a second end of the programming transistor being connected to the common node, and a word line being connected to a gate of the programming transistor.

2. The mTCAM cell of claim 1, the match-line transistor comprising a second end, the second end connected to a voltage rail.

3. The mTCAM cell of claim 1, further comprising control circuitry to perform one or more operations of write, read, or search the mTCAM cell.

4. The mTCAM cell of claim 3, the control circuitry configured to perform a search operation in response to receiving an instruction from a processing circuitry of a device in which the mTCAM cell is implemented.

5. The mTCAM cell of claim 1, the programming transistor configured to program the first memristor and the second memristor, individually or simultaneously.

6. The mTCAM cell of claim 1, the first memristor and the second memristor comprising one of: a memory element that changes the resistance across a dielectric solid-state material; a resistive random-access memory element; a phase-change memory element PCM of PCRAM); a conductive-bridging memory element; a magnetoresistive memory element (MRAM).

7. The mTCAM cell of claim 1, further comprising a capacitor having a first end connected to the common node and a second end connected to a ground.

8. A memristor-based ternary content addressable memory (mTCAM) comprising:
a processing circuitry;
an array of a plurality of mTCAM cells communicatively coupled to the processing circuitry;
each mTCAM cell comprises:
a first memristor connected in series to a second memristor, wherein:
a first end of the first memristor is connected to a first data line;
a first end of the second memristor is connected to a second data line; and
a second end of the first memristor and a second end of the second memristor are connected together at a common node;
a match-line transistor being connected on a first end to a match line, a gate of the match-line transistor being connected to the common node;
a programming transistor being connected on a first end to a third data line, a second end of the programming transistor being connected to the common node, and a word line being connected to a gate of the programming transistor.

9. The mTCAM of claim 8, each match-line transistor of the plurality of mTCAM cells comprising a second end, the second end connected to a voltage rail.

10. The mTCAM of claim 8, further comprising a control circuitry to perform one or more operations of write, read, or search the plurality of mTCAM cell.

11. The mTCAM of claim 10, the control circuitry configured to perform a search operation in response to receiving an instruction from the processing circuitry.

12. The mTCAM of claim 8, the programming transistor configured to program the first memristor and the second memristor, individually or simultaneously.

13. The mTCAM of claim 8, wherein the first memristor and the second memristor comprise one of: a memory element that changes the resistance across a dielectric solid-state material; a resistive random-access memory element; a phase-change memory element PCM of PCRAM); a conductive-bridging memory element; a magnetoresistive memory element (MRAM).

14. The mTCAM of claim 8, each mTCAM cell further comprising a capacitor having a first end connected to the common node and a second end connected to a ground.

15. The mTCAM of claim 8, wherein each row of the array of the plurality of mTCAM cells comprises a word storage block configured to store a data word identifying an address associated with a corresponding communications pot of a communications circuitry.

16. The mTCAM of claim 8, further comprising a non-transitory machine-readable storage media storing instructions that, when executed by the processing circuitry, cause the processing circuitry to send a control signal to the control circuitry.

17. The mTCAM of claim 8, the control circuitry comprising one or more column drivers and one or more row drivers, wherein:
the one or more column drivers are communicatively coupled with a plurality of first data lines, a plurality of second data lines, and a plurality of third data lines;
the one or more row drivers are communicatively coupled with a plurality of match lines and word lines.

18. A method comprising:
applying, by a control circuitry of a memristor-based ternary content memory (mTCAM) comprising a plurality of mTCAM cells, a selection voltage to a word line of an associated word storage block to be programmed;
detecting, by the control circuitry, a current resistance state of a first memristor and a resistance state of a second memristor;
determining, by the control circuitry, a stored bit value for each mTCAM cell associated with the word storage block;
applying, by the control circuitry, a combination of voltages to a plurality of data lines associated with each mTCAM cell based on the determined stored bit value, a desired bit value, and the current resistance states of the first memristor and the second memristor; and
removing, by the control circuitry, the selection voltage from the word line.

19. The method of claim 18, wherein a plurality of word storage blocks are to be programmed and applying the selection voltage comprises applying the selection voltage to a set of the plurality of word storage blocks to program a bit cell of each word storage block associated with the plurality of data lines with a same data value.

20. The method of claim 18, wherein in response to determining all of a plurality of stored bit values of the bit cells of the word storage block are equal to each corresponding desired bit value, removing the selection voltage from the word line.

* * * * *